US012677369B2

(12) United States Patent
Jeong et al.

(10) Patent No.: US 12,677,369 B2
(45) Date of Patent: Jul. 7, 2026

(54) PRINTED CIRCUIT BOARD

(71) Applicant: SAMSUNG ELECTRO-MECHANICS CO., LTD., Suwon-si (KR)

(72) Inventors: Sang Ho Jeong, Suwon-si (KR); Jong Eun Park, Suwon-si (KR); Chang Hwa Park, Suwon-si (KR); Hyun Hu Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 178 days.

(21) Appl. No.: 18/588,905

(22) Filed: Feb. 27, 2024

(65) Prior Publication Data

US 2024/0431023 A1     Dec. 26, 2024

(30) Foreign Application Priority Data

Jun. 23, 2023     (KR) ........................ 10-2023-0080770

(51) Int. Cl.
| | |
|---|---|
| *H05K 1/03* | (2006.01) |
| *H05K 1/11* | (2006.01) |
| *H05K 1/182* | (2026.01) |

(52) U.S. Cl.
CPC ........... *H05K 1/0306* (2013.01); *H05K 1/115* (2013.01); *H05K 1/182* (2013.01); *H05K 2201/09827* (2013.01)

(58) Field of Classification Search
CPC ........ H05K 1/182; H05K 1/183; H05K 1/185; H05K 3/4697
See application file for complete search history.

(56) References Cited

U.S. PATENT DOCUMENTS

| | | | |
|---|---|---|---|
| 2017/0186684 A1* | 6/2017 | Yamasaki | ............. H01L 23/147 |
| 2022/0039261 A1* | 2/2022 | Hwang | .................. H05K 3/429 |

FOREIGN PATENT DOCUMENTS

| | | |
|---|---|---|
| JP | 2017-118068 A | 6/2017 |
| KR | 10-2022-0015011 A | 2/2022 |

OTHER PUBLICATIONS

Gül Dogan, et al., "Micromachining of Al2O3 thin films via laser drilling and plasma etching for interfacing copper", Materials & Design 210 (2021) 110114, pp. 1-11.

* cited by examiner

*Primary Examiner* — Nathan Milakovich
(74) *Attorney, Agent, or Firm* — MORGAN, LEWIS & BOCKIUS LLP

(57) ABSTRACT

A printed circuit board includes a first insulating layer; a first wiring layer disposed on an upper surface of the first insulating layer; a second insulating layer disposed on the upper surface of the first insulating layer and having a cavity; and a first barrier layer having at least a portion disposed between the first and second insulating layers and in contact with a side surface of at least a portion of the first wiring layer.

19 Claims, 16 Drawing Sheets

100E

PRINTED CIRCUIT BOARD

CROSS-REFERENCE TO RELATED APPLICATIONS

This application claims the benefit of priority to Korean Patent Application No. 10-2023-0080770, filed on Jun. 23, 2023 in the Korean Intellectual Property Office, the disclosure of which is incorporated herein by reference in its entirety.

BACKGROUND

1. Field

The present disclosure relates to a printed circuit board.

2. Description of Related Art

As a package has been designed to have larger area, a technique for embedding bridges on a package level has been developed. To embed a bridge, it may be necessary to form a cavity in a substrate, and generally, a laser may be used, and a metal stopper layer may be applied to control a depth of a cavity. However, in this case, costs may increase due to processes of forming and removing the metal stopper layer, and design freedom may be reduced.

SUMMARY

An aspect of the present disclosure is to provide a printed circuit board which may form a cavity in the board without applying a metal stopper layer.

An aspect of the present disclosure is to form a barrier layer instead of a metal stopper layer using a thin film deposition method, such as an atomic layer deposition (ALD) or molecular vapor deposition (MVD) method and to form a cavity in the board using the layer.

For example, according to an aspect of the present disclosure, a printed circuit board includes a first insulating layer; a first wiring layer disposed on an upper surface of the first insulating layer; a second insulating layer disposed on an upper surface of the first insulating layer and having a cavity; and a first barrier layer having at least a portion disposed between the first and second insulating layers and in contact with a side surface of at least a portion of the first wiring layer.

For example, according to an aspect of the present disclosure, a printed circuit board includes a first insulating layer; a wiring layer disposed on an upper surface of the first insulating layer; a second insulating layer disposed on an upper surface of the first insulating layer and having a cavity; and a barrier layer having at least a portion disposed between the first and second insulating layers, wherein an upper surface of the barrier layer and an upper surface of the wiring layer, or a lower surface of the barrier layer and a lower surface of the wiring layer are substantially coplanar with each other.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
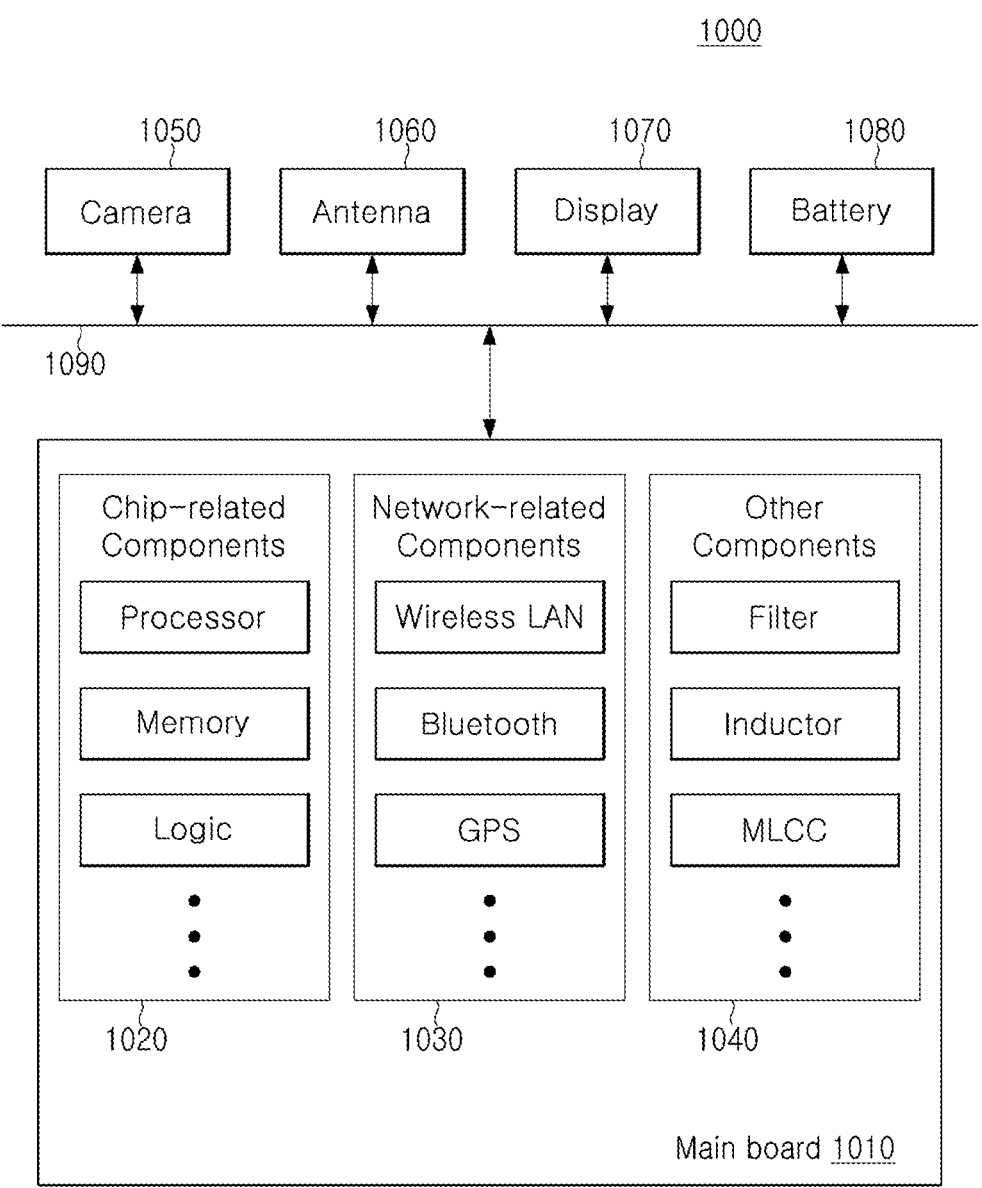
FIG. 1 is a block diagram illustrating an example embodiment of an electronic device system.

FIG. 1 is a block diagram illustrating an example embodiment of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. Also, other components 1040 may be combined with each other, together with the chip related components 1020 and/or the network related components 1030 described above.

Depending on a type of the electronic device 1000, the electronic device 1000 may include other components which may or may not be physically or electrically connected to the mainboard 1010. The other components may include, for example, a camera module 1050, an antenna module 1060, a display 1070, and a battery 1080. However, the other components are not limited thereto, and may include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. The other components may also include other components used for various purposes depending on a type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
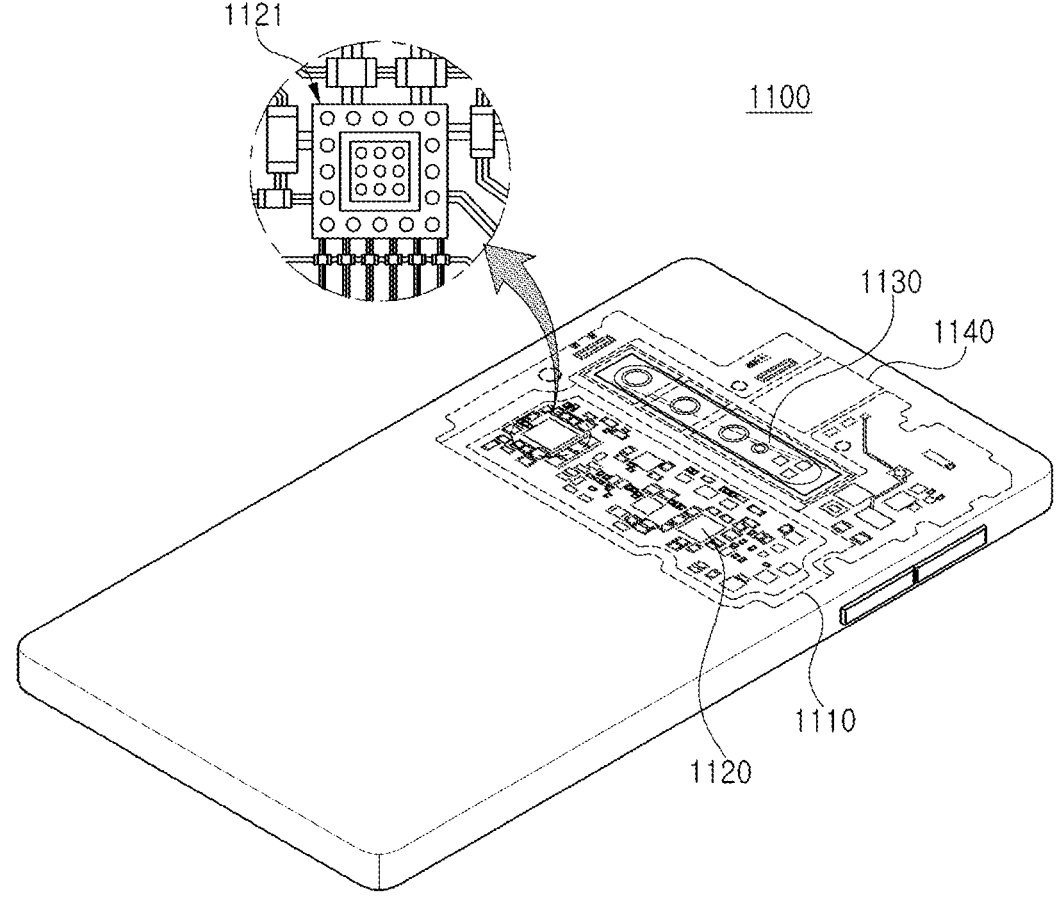
FIG. 2 is a perspective diagram illustrating an example embodiment of an electronic device.

FIG. 2 is a perspective diagram illustrating an example embodiment of an electronic device.

Referring to FIG. 2, an electronic device may be a smartphone 1100. A motherboard 1110 may be accommodated in the smartphone 1100, and various components 1120 may be physically or electrically connected to the motherboard 1110. Also, other components which may or may not be physically or electrically connected to the motherboard 1110, such as a camera module 1130, may be accommodated in the body 1101. A portion of the components 1120 may be the chip related components, such as, for example, a component package 1121, but an example embodiment thereof is not limited thereto. The component package 1121 may have the form of a printed circuit board on which electronic components including active components and/or passive components are surface-mounted. Alternatively, the component package 1121 may be configured in the form of a printed circuit board in which active components and/or passive components are buried. The electronic device is not necessarily limited to the smartphone 1100, and may be other electronic devices as described above.

Printed Circuit Board

Figure 3:
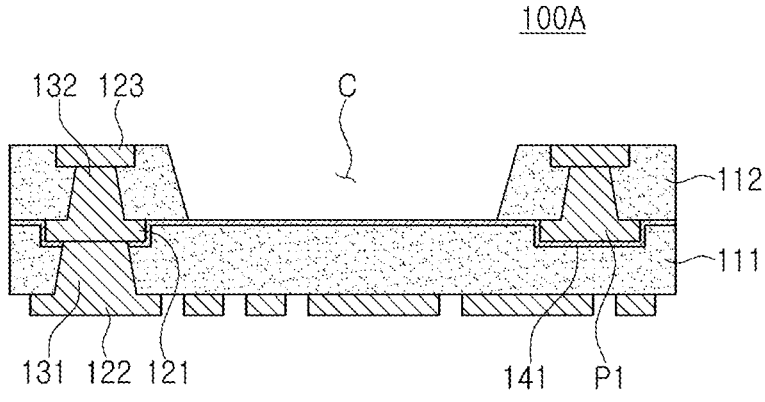
FIG. 3 is a cross-sectional diagram illustrating an example embodiment of a printed circuit board.

FIG. 3 is a cross-sectional diagram illustrating an example embodiment of a printed circuit board.

Referring to the drawings, according to an example, a printed circuit board 100A may include a first insulating layer 111, a first wiring layer 121 embedded in an upper side of the first insulating layer 111, a second insulating layer 112 disposed on an upper surface of the first insulating layer 111, covering at least a portion P1 of the first wiring layer 121, and having a cavity C, a first barrier layer 141 having at least a portion disposed between the first and second insulating layers 111 and 112, a second wiring layer 122 disposed on a lower surface of first insulating layer 111, a first via layer 131 penetrating through at least a portion of the first insulating layer 111 and connecting at least a portion of each of the first and second wiring layers 121 and 122, a third wiring layer 123 embedded on an upper side of the second insulating layer 112, and a second via layer 132 penetrating through at least a portion of the second insulating layer 112 and connecting at least a portion of the first wiring layer 121 and at least a portion of the third wiring layer 123 to each other.

The first barrier layer 141 may be formed using a thin film deposition method, such as an atomic layer deposition (ALD) method or a molecular vapor deposition (MVD) method. For example, the first barrier layer 141 may include a thin insulating film having a thickness less than 0.1 μm, preferably about 0.001 μm to 0.01 μm, and the insulating film may be an alumina film, but an embodiment thereof is not limited thereto. In this case, the first barrier layer 141 may be formed to cover the first wiring layer 121 between the first and second insulating layers 111 and 112 after the first wiring layer 121 is formed. Accordingly, the first barrier layer 141 may be in contact with a side surface of at least a portion P1 of the first wiring layer 121, and may preferably cover at least a portion of each of a side surface and a lower surface of P1 of the first wiring layer 121. Also, an upper surface of the first barrier layer 141 and an surface of the first wiring layer 121 may be upper substantially coplanar with each other. Also, an upper surface of the first insulating layer 111 and an upper surface of at least a portion P1 of the first wiring layer 121 may have a step difference. The first barrier layer 141 may be used as a stopper for blast (e.g., sand blast) processing and also for laser (e.g., CO2 laser) processing when the cavity C is formed in the second insulating layer 112. Accordingly, a footing may be prevented from being formed on a bottom surface of the cavity C. Also, the first barrier layer 141 may work as an adhesive protective layer and may improve reliability.

The cavity C may penetrate through the second insulating layer 112. At least a portion of the first barrier layer 141 may be disposed on a bottom surface of cavity C. For example, a bottom surface of cavity C may include the first barrier layer 141. Also, at least a portion of an upper surface of the first barrier layer 141 may be exposed from the first and second insulating layers 111 and 112 by the cavity C. Various types of components may be disposed in cavity C, and the components may be attached to an upper surface of the exposed first barrier layer 141. In this case, the component may be embedded easily and reliability may be improved. The cavity C may have a tapered shape in which a width of an upper side may be greater than a width of a lower side, but an embodiment thereof is not limited thereto.

The first and second insulating layers 111 and 112 may include an insulating material. The insulating material may include a thermosetting resin such as epoxy resin, a thermoplastic resin such as polyimide, or a material including inorganic filler, organic filler, and/or glass fiber along with the resin. For example, the insulating material may be a non-photosensitive insulating material such as Ajinomoto build-up film (ABF) or prepreg (PPG), but an embodiment thereof is not limited thereto, and other polymer materials may be used. Also, the insulating material may be a photosensitive insulating material such as a photoimageable dielectric (PID). A boundary between the first and second insulating layers 111 and 112 may be distinct from each other, but the first and second insulating layers 111 and 112 may be integrated with each other to the extent that it may be difficult to distinguish the boundary after curing. When the boundary between the first and second insulating layers 111 and 112 is indistinct, the boundary may be distinguished by drawing a conceptual line with respect to an upper surface of at least a portion P1 of the first wiring layer 121 in consideration of the manufacturing process.

Each of the first to third wiring layers 121, 122, and 123 may include a metal material. The metal material may include copper (Cu), aluminum (Al), silver (Ag), tin (Sn), gold (Au), nickel (Ni), lead (Pb), titanium (Ti), and/or alloys thereof. Preferably, the metal material may include copper (Cu), but an embodiment thereof is not limited thereto. Each of the first to third wiring layers 121, 122, and 123 may perform various functions depending on a design. For example, each of the first to third wiring layers 121, 122, and 123 may include a signal pattern, a power pattern, and a ground pattern. Each of the patterns may have various forms such as a line, a plain, and a pad. Each of the first to third wiring layers 121, 122, and 123 may include an electroless plating layer (or chemical copper) and an electrolytic plating layer (or electric copper), may include metal foil (or copper foil) and an electrolytic plating layer (or electrolytic copper), or may include a metal foil (or copper foil), an electroless plating layer (or chemical copper) and an electrolytic plating layer (or electrical copper). A sputtering layer may be included instead of an electroless plating layer (or chemical copper), and both a sputtering layer and an electroless plating layer may be included if desired.

Each of the first and second via layers 131 and 132 may include a metal material. The metal material may include copper (Cu), aluminum (Al), silver (Ag), tin (Sn), gold (Au), nickel (Ni), lead (Pb), titanium (Ti), and/or alloys thereof, and preferably, the metal material may include copper (Cu), but an embodiment thereof is not limited thereto. Each of the first and second via layers 131 and 132 may include microholes. A microhole may be a filled via filling the via hole, or a conformal via disposed along a wall surface of the via hole. The microholes may be disposed in stacked type and/or staggered type. The microholes may perform various functions depending on a design of the corresponding layer. For example, the microholes may include a ground via, a power via, and a signal via. The first and second via layers 131 and 132 may include an electroless plating layer (or chemical copper) and an electrolytic plating layer (or electrical copper), respectively, but an embodiment thereof is not limited thereto. A sputtering layer may be formed instead of an electroless plating layer, or both a sputtering layer and an electroless plating layer may be included. The first and second via layers 131 and 132 may have tapered shapes tapered in the same direction. For example, each of the first and second via layers 131 and 132 may have a tapered shape of which an upper side width is smaller than a lower side width on a cross-section, but an embodiment thereof is not limited thereto.

Figure 4:
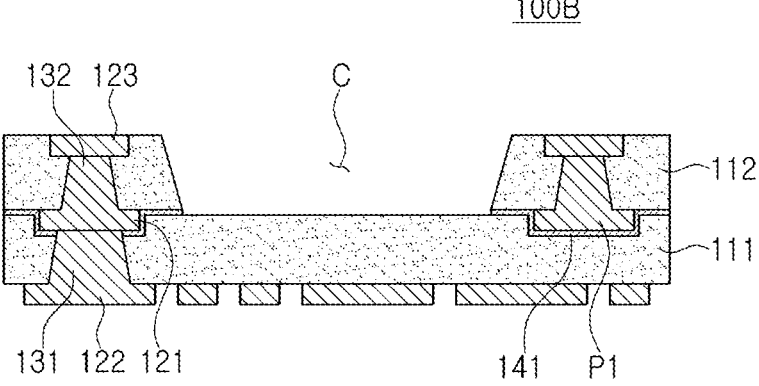
FIG. 4 is a cross-sectional diagram illustrating another example embodiment of a printed circuit board.

FIG. 4 is a cross-sectional diagram illustrating another example embodiment of a printed circuit board.

Referring to the drawings, in a printed circuit board 100B according to another example, differently from the printed circuit board 100A according to the above-described example, the first barrier layer 141 exposed through the cavity C may be removed by plasma etching after forming the cavity C. In this case, the cavity C may expose at least a portion of an upper surface of the first insulating layer 111, and at least a portion of an upper surface of the first insulating layer 111 exposed through the cavity C may have a step difference from an upper surface of at least a portion P1 of the first wiring layer 121. Also, at least a portion of the side surface of the first barrier layer 141 may be exposed through the cavity C, and at least a portion of the side surface exposed through the cavity C of the first barrier layer 141 may not have a step difference with a wall surface of cavity C. For example, a groove may be prevented from being formed on an edge of cavity C.

The other descriptions are substantially the same as those described with respect to the printed circuit board 100A according to the above-described example, and accordingly, overlapping descriptions will not be provided.

FIGS. 5A to 5E are cross-sectional diagrams illustrating an example of processes of manufacturing the printed circuit board in FIG. 3 and the printed circuit board in FIG. 4.

Figure 5A:
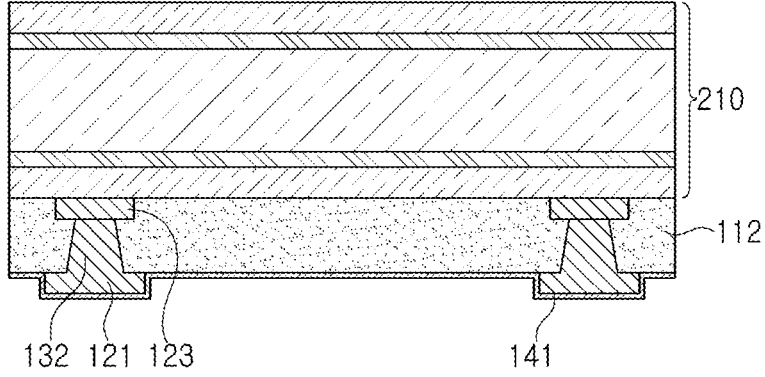
FIGS. 5A, 5B, 5C, 5D, and 5E are cross-sectional diagrams illustrating an example of processes of manufacturing the printed circuit board in FIG. 3 and the printed circuit board in FIG. 4.

Referring to FIG. 5A, first, a board may be formed in the form of an embedded trace substrate (ETS) using the carrier 210. For example, a third wiring layer 123 may be formed on the carrier 210 through a plating process, a second insulating layer 112 may be formed on the carrier 210 through a lamination process, a via hole may be processed in the second insulating layer 112 through laser processing, and the first wiring layer 121 and the second via layer 132 may be formed on the second insulating layer 112 through a plating process. In the carrier 210, a copper (Cu) layer and a nickel (Ni) layer may be sequentially formed on both surfaces of the core layer, but an embodiment thereof is not limited thereto. Thereafter, a first barrier layer 141 may be formed to cover the first wiring layer 121 on a lower surface of the second insulating layer 112 using a thin film deposition method, such as an atomic layer deposition (ALD) method or a molecular vapor deposition (MVD) method.

Figure 5B:
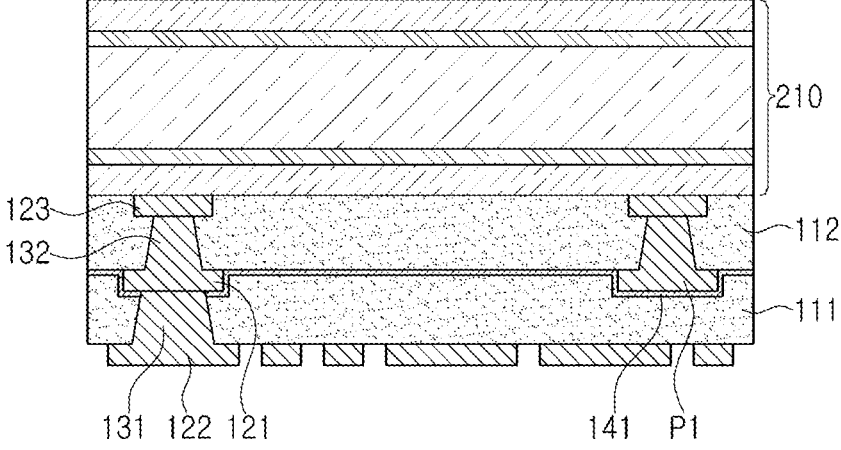

Referring to FIG. 5B, the first insulating layer 111 may be formed on a lower surface of the second insulating layer 112 by covering the first barrier layer 141. The first insulating layer 111 may be formed through a lamination process. Thereafter, a via hole may be processed in the first insulating layer 111 through laser processing, and a second wiring layer 122 and a first via layer 131 may be formed on the first insulating layer 111 through a plating process. When the via holes are processed, at least a portion of the first barrier layer 141 may be removed to ensure interlayer continuity.

Figure 5C:
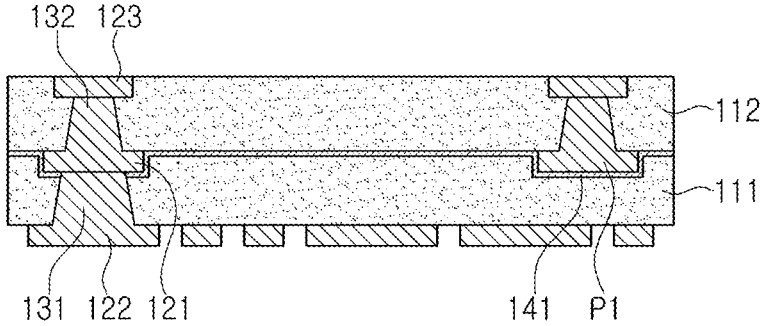

Referring to FIG. 5C, the carrier 210 may be removed. For example, a laminate manufactured from the carrier 210 may be detached, and a copper (Cu) layer and a nickel (Ni) layer of the carrier 210 remaining in the laminate after detachment may be sequentially removed by etching.

Figure 5D:
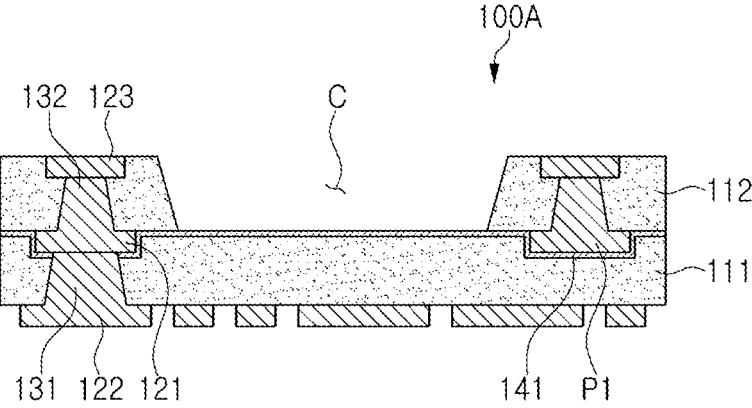

Referring to FIG. 5D, a cavity C penetrating through the second insulating layer 112 may be formed through CO2 laser processing using the first barrier layer 141 as a stopper. Through a series of processes, the printed circuit board 100A according to the above-described example may be manufactured.

Figure 5E:
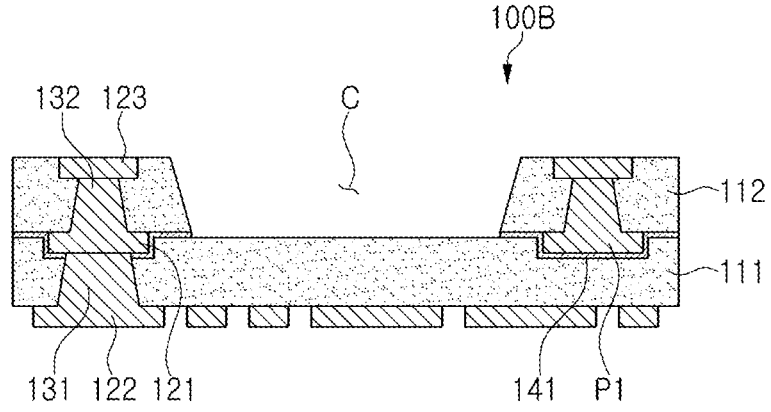

Referring to FIG. 5E, at least a portion of the first barrier layer 141 exposed through the cavity C may be removed by plasma etching. Through a series of processes, the printed circuit board 100B according to another example described above may be manufactured.

The other descriptions may be substantially the same as those described with respect to the printed circuit boards 100A and 100B described above, and accordingly, overlapping descriptions will not be provided.

Figure 6:
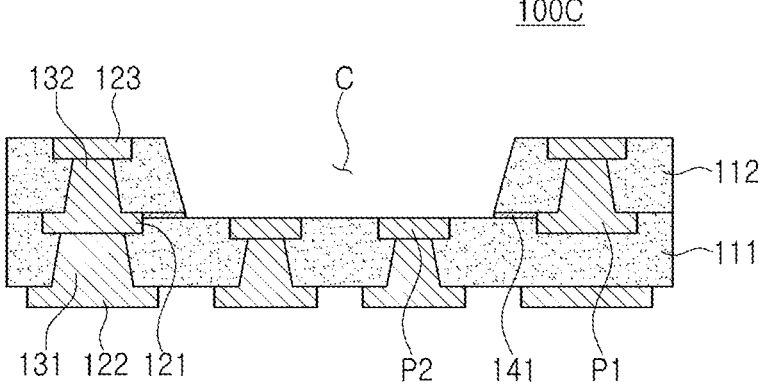
FIG. 6 is a cross-sectional diagram illustrating another example of a printed circuit board.

FIG. 6 is a cross-sectional diagram illustrating another example of a printed circuit board.

Referring to the drawings, in a printed circuit board 100C according to another example, differently from the printed circuit board 100B according to another example described above, at least a portion P2 of the first wiring layer 121 may be exposed through the cavity C. In this case, a component disposed in the cavity C may be connected to at least a portion P2 of the first wiring layer 121 and may be electrically connected to a circuit in the board. Accordingly, various electrical connection paths may be assured. To this end, after the first barrier layer 141 is formed only in partial regions between the first and second insulating layers 111 and 112, only the regions exposed through the cavity C may be selectively removed by plasma etching. Accordingly, at least a portion P1 of the first wiring layer 121 and at least a portion P2 of the other upper surfaces may have a step difference from each other.

The other descriptions may be substantially the same as those described with respect to the printed circuit boards 100A and 100B described above, and accordingly, overlapping descriptions will not be provided.

FIGS. 7A to 7G are cross-sectional diagrams illustrating an example of processes of manufacturing the printed circuit board in FIG. 6.

Figure 7A:
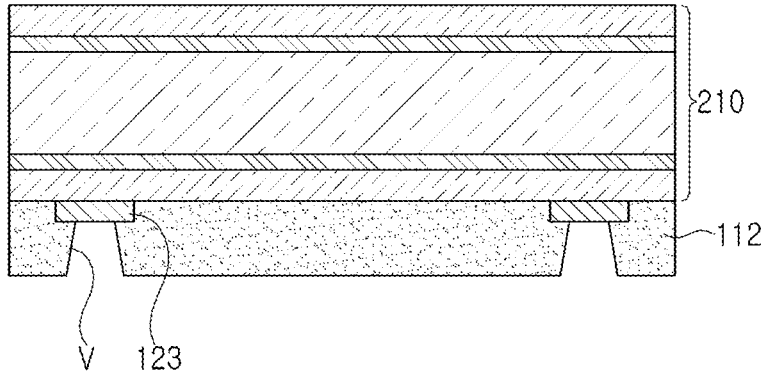
FIGS. 7A, 7B, 7C, 7D, 7E, 7F, and 7G are cross-sectional diagrams illustrating an example of processes of manufacturing the printed circuit board in FIG. 6.

Referring to FIG. 7A, a third wiring layer 123 may be formed on a carrier 210 through a plating process, the second insulating layer 112 may be formed on the carrier 210 through a lamination process, and a via hole V may be processed in the second insulating layer 112 by laser processing. The carrier 210 may include a copper (Cu) layer and a nickel (Ni) layer sequentially formed on both surfaces of the core layer, but an embodiment thereof is not limited thereto.

Figure 7B:
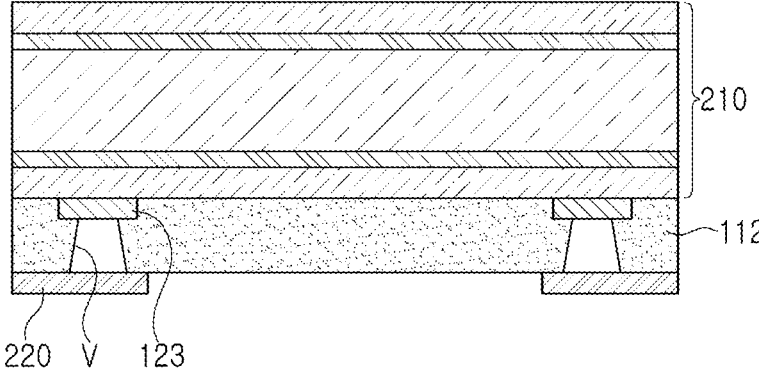
Figure 7C:
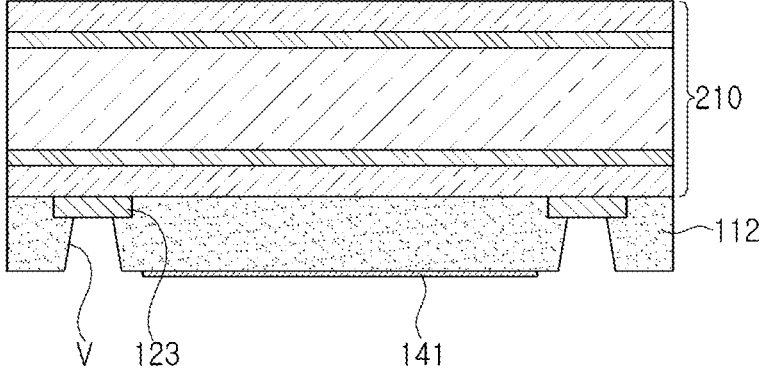

Referring to FIGS. 7B and 7C, first, a pattern region for forming the first barrier layer 141 may be formed through the mask 220, and a first barrier layer 141 may be formed in the mask pattern region on a lower surface of the second insulating layer 112 using a thin film deposition method, such as an atomic layer deposition (ALD) method or a molecular vapor deposition (MVD) method. Thereafter, the mask 220 may be removed. The mask 220 may be a metal mask and may be removed by detachment, but an embodiment thereof is not limited thereto.

Figure 7D:
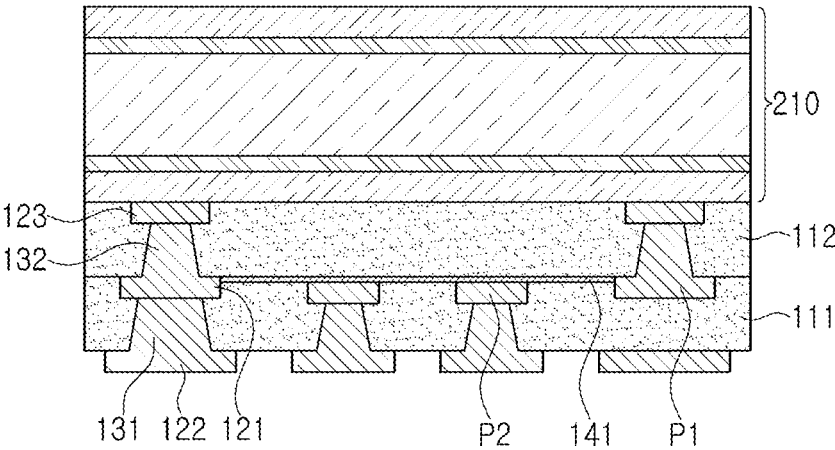

Referring to FIG. 7D, a first wiring layer 121 and a second via layer 132 may be formed on the second insulating layer 112 and the first barrier layer 141 through a plating process. In this case, at least a portion P1 of the first wiring layer 121 and at least a portion P2 other than the first wiring layer 121 may have a step difference. Thereafter, the first insulating layer 111 may be formed on the lower surface of the second insulating layer 112 by covering the first barrier layer 141. The first insulating layer 111 may be formed through a lamination process. Thereafter, a via hole may be processed in the first insulating layer 111 through laser processing, and a second wiring layer 122 and a first via layer 131 may be formed on the first insulating layer 111 through a plating process.

Figure 7E:
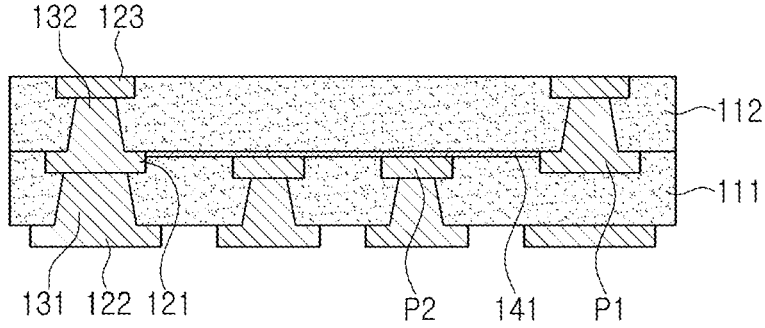

Referring to FIG. 7E, the carrier 210 may be removed. For example, a laminate manufactured from the carrier 210 may be detached, and a copper (Cu) layer and a nickel (Ni) layer of the carrier 210 remaining in the laminate after the detachment may be sequentially removed by etching.

Figure 7F:
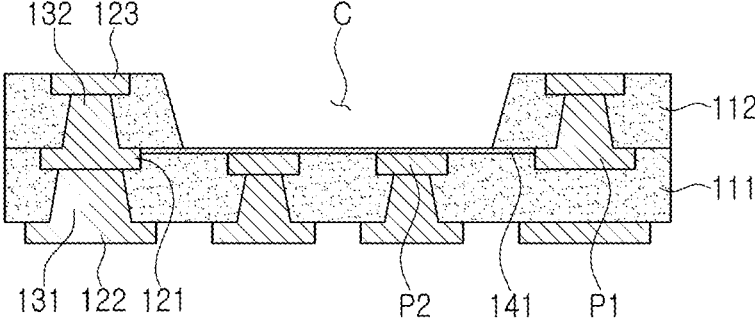
Figure 7G:
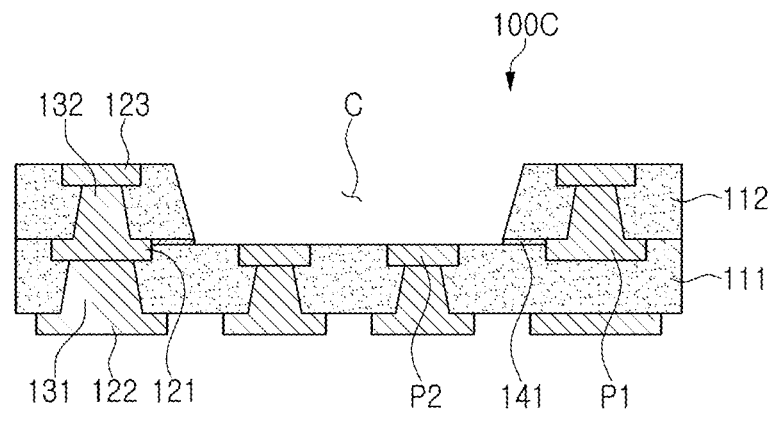

Referring to FIGS. 7F and 7G, a cavity C penetrating through the second insulating layer 112 may be formed through $CO_2$ laser processing using the first barrier layer 141 as a stopper. Thereafter, at least a portion of the first barrier layer 141 exposed through the cavity C may be removed by plasma etching. Through a series of processes, the printed circuit board 100C according to another example described above may be manufactured.

The other descriptions may be substantially the same as described with respect to the above-described printed circuit boards 100A, 100B, and 100C, and accordingly, overlapping descriptions will not be provided.

Figure 8:
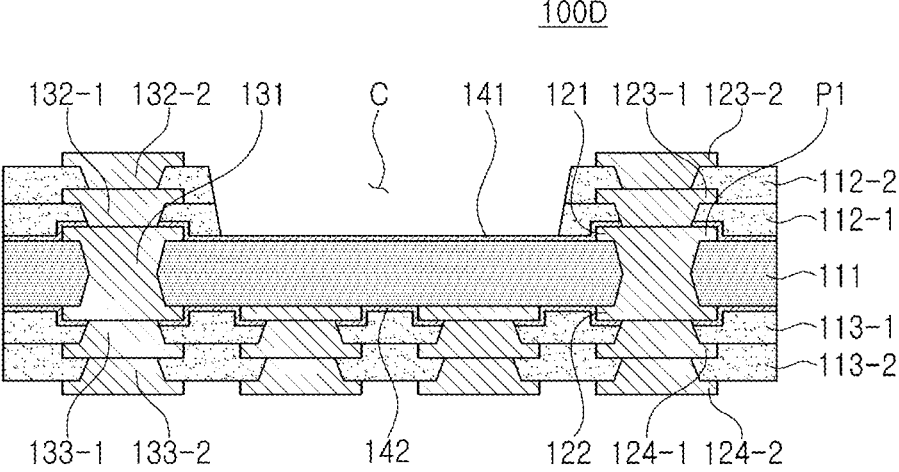
FIG. 8 is a cross-sectional diagram illustrating another example of a printed circuit board.

FIG. 8 is a cross-sectional diagram illustrating another example of a printed circuit board.

Referring to the drawing, a printed circuit board 100D according to another example may include a first insulating layer 111, a first wiring layer 121 disposed on an upper surface of the first insulating layer 111, a second disposed on a lower surface of the first insulating layer 111, a first via layer 131 penetrating through the first insulating layer 111 and connecting at least a portion of the first wiring layer 121 to at least a portion of the second wiring layer 122, one or more second insulating layers 112-1 and 112-2 disposed on an upper surface of the first insulating layer 111 and having a cavity C, a first barrier layer 141 having at least a portion disposed between the first and second insulating layers 111, 112-1, and 112-2, one or more third insulating layers 113-1 and 113-2 disposed on a lower surface of the first insulating layer 111, a second barrier layer 142 having at least a portion disposed between the first and third insulating layers 111, 113-1, and 113-2, one or more third wiring layers 123-1 and 123-2, disposed on upper surfaces of one or more second insulating layers 112-1 and 112-2, respectively, one or more second via layers 132-1, 132-2 penetrating through one or more second insulating layers 112-1 and 112-2, respectively, one or more fourth wiring layers 124-1 and 124-2 disposed on lower surfaces of one or more third insulating layers 113-1 and 113-2, respectively, and one or more third via layers 133-1 and 133-2 penetrating through one or more third insulating layers 113-1 and 113-2, respectively. One or more second via layers 132-1 and 132-2 may connect the first wiring layer 121 to one or more third wiring layers 123-1 and 123-2. One or more third via layers 133-1 and 133-2 may connect the second wiring layer 122 to one or more fourth wiring layers 124-1 and 124-2.

The first and second barrier layers 141 and 142 may be formed using a thin film deposition method, such as an atomic layer deposition (ALD) method and a molecular vapor deposition (MVD) method. For example, each of the first and second barrier layers 141 and 142 may include a thin insulating film having a thickness less than 0.1 μm, preferably about 0.001 μm to 0.01 μm, and the insulating film may be an alumina film, but an embodiment thereof is not limited thereto. In this case, the first and second barrier layers 141 and 142 may be formed to cover the first and second wiring layers 121 and 122, respectively, after the first and second wiring layers 121 and 122 are formed. Accordingly, the first barrier layer 141 may be in contact with a side surface of at least a portion P1 of the first wiring layer 121, and may preferably cover at least a portion of each of the side surface and upper surface of P1 of the first wiring layer 121. Also, the second barrier layer 142 may be in contact with a side surface of at least a portion of the second wiring layer 122, and may preferably cover at least a portion of each of a side surface and a lower surface of at least a portion of the second wiring layer 122. Also, a lower surface of the first barrier layer 141 and a lower surface of the first wiring layer 121 may be substantially coplanar with each other. Also, an upper surface of the second barrier layer 142 and an upper surface of the second wiring layer 122 may be substantially coplanar with each other. This first barrier layer 141 may also be used as a stopper for blast (e.g., sandblasting) processing and also laser (e.g., CO2 laser) processing when the cavity C is formed in one or more second insulating layers 112-1 and 112-2. Accordingly, a footing may be prevented from being formed on a bottom surface of the cavity C. Also, the first and second barrier layers 141 and 142 may be adhesive protective layers, and may improve reliability.

The cavity C may penetrate one or more second insulating layers 112-1 and 112-2. At least a portion of the first barrier layer 141 may be disposed on a bottom surface of cavity C. For example, the bottom surface of cavity C may include the first barrier layer 141. Also, at least a portion of an upper surface of the first barrier layer 141 may be exposed from the first and second insulating layers 111, 112-1, and 112-2 by the cavity C. Various types of components may be disposed in the cavity C, and the components may be attached to an upper surface of the exposed first barrier layer 141. In this case, the components may be easily embedded and reliability may be improved. The cavity C may have a tapered shape of which a width of an upper side may be greater than a width of a lower side, but an embodiment thereof is not limited thereto.

Each of the first to third insulating layers 111, 112-1, 112-2, 113-1, and 113-2 may include an insulating material. The insulating material may include a thermosetting resin such as epoxy resin, a thermoplastic resin such as polyimide, or a material including inorganic filler, organic filler, and/or glass fiber along with the resin. For example, the insulating material may be a non-photosensitive insulating material such as Ajinomoto build-up film (ABF) or prepreg (PPG), but an embodiment thereof is not limited thereto, and other polymer materials may be used. Also, the insulating material may be a photosensitive insulating material such as a photoimageable dielectric (PID). Preferably, the first insulating layer 111 may be a core layer, and one or more second and third insulating layers 112-1, 112-2, 113-1, and 113-2 may be build-up layers. Accordingly, the first insulating layer 111 may have a thickness greater than those of one or more of the second and third insulating layers 112-1, 112-2, 113-1, and 113-2 and may have a greater modulus than those of one or more of the second and third insulating layers 112-1, 112-2, 113-1, and 113-2. One or more second insulating layers 112-1 and 112-2 may have distinct boundaries, or may be integrated with each other without boundaries after curing. One or more third insulating layers 113-1 and 113-2 may have distinct boundaries, or may be integrated with each other without boundaries after curing. When the boundary between one or more second insulating layers 112-1 and 112-2 are indistinct, a conceptual line may be drawn with respect to a lower surface of one of the third wiring layers 123-1 and 123-2 in consideration of the manufacturing process such that the boundary may be distinct. When the boundaries between one or more third insulating layers 113-1 and 113-2 are indistinct, a conceptual line may be drawn with respect to an upper surface of one of one or more fourth wiring layers 124-1 and 124-2 in consideration of the manufacturing process such that the boundary may be distinct.

Each of the first to fourth wiring layers 121, 122, 123-1 and 123-2, 124-1, and 124-2 may include a metal material. The metal material may include copper (Cu), aluminum (Al), silver (Ag), tin (Sn), gold (Au), nickel (Ni), lead (Pb), titanium (Ti), and/or alloys thereof. Preferably, the metal material may include copper (Cu), but an embodiment thereof is not limited thereto. Each of the first to fourth wiring layers 121, 122, 123-1 and 123-2, 124-1, and 124-2 may perform various functions depending on a design. For example, each of the first to fourth wiring layers 121, 122, 123-1 and 123-2, 124-1, and 124-2 may include a signal pattern, a power pattern, and a ground pattern. Each of these patterns may have various shapes such as a line shape, a plain shape, or a pad shape. The first to fourth wiring layers 121, 122, 123-1 and 123-2, 124-1, and 124-2 may include an electroless plating layer (or chemical copper) and an electrolytic plating layer (or electric copper), respectively, or may include metal foil (or copper foil) and an electrolytic plating layer (or electrolytic copper), or may include a metal foil (or copper foil), an electroless plating layer (or chemical copper) and an electrolytic plating layer (or electrical copper). A sputtering layer may be included instead of an electroless plating layer (or chemical copper), and both a sputtering layer and an electroless plating layer may be included if desired.

Each of the first to third via layers 131, 132-1, 132-2, 133-1, and 133-2 may include a metal material. The metal material may include copper (Cu), aluminum (Al), silver (Ag), tin (Sn), gold (Au), nickel (Ni), lead (Pb), titanium (Ti), and/or alloys thereof. Preferably, the metal material may include copper (Cu), but an embodiment thereof is not limited thereto. The first via layer 131 may include a through-via. The through-via may be a filled via filling the through-hole, or a conformal via disposed along a wall surface of the through-hole. Alternatively, the through-via may be a conformal type and may include a plug therein. Each of one or more second and third via layers 132-1, 132-2, 133-1, and 133-2 may include microholes. A microhole may be a filled via filling the via hole, or a conformal via disposed along a wall surface of the via hole. The microhole may be disposed in stacked type and/or staggered type. The through-vias and the microholes may perform various functions depending on designs of the corresponding layers. For example, the through-vias and the microholes may include a ground via, a power via, a signal via. Each of the first to third via layers 131, 132-1, 132-2, 133-1, and 133-2 may include an electroless plating layer (or chemical copper) and an electrolytic plating layer (or electric copper), but an embodiment thereof is not limited thereto. A sputtering layer may be formed instead of an electroless plating layer, and both a sputtering layer and an electroless plating layer may be included if desired. The first via layer 131 may have an hourglass shape, or a cylindrical shape, and one or more second and third via layers 132-1, 132-2, 133-1, and 133-2 may have a shape tapered in opposite directions.

Figure 9:
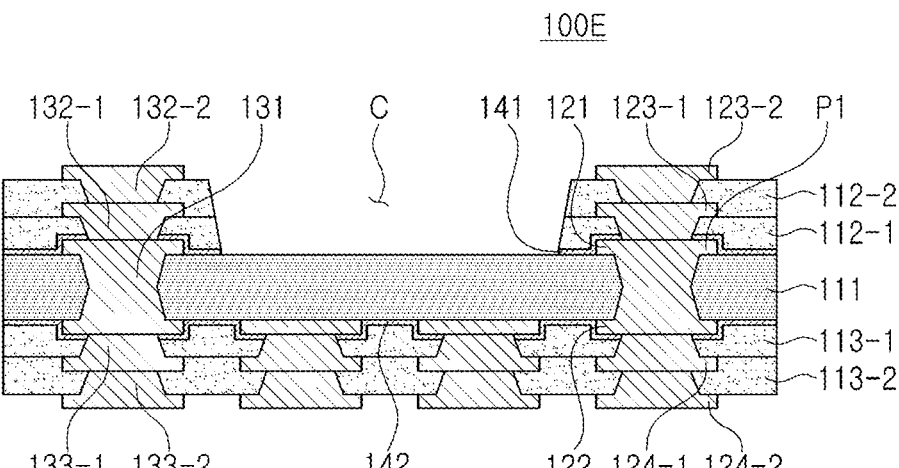
FIG. 9 is a cross-sectional diagram illustrating another example of a printed circuit board.

FIG. 9 is a cross-sectional diagram illustrating another example of a printed circuit board.

Referring to the drawings, in a printed circuit board 100E according to another example, differently from the printed circuit board 100D according to another example described above, the first barrier layer 141 exposed through the cavity C through plasma etching after the cavity C is formed may be removed. In this case, the cavity C may expose at least a portion of an upper surface of the first insulating layer 111. Also, at least a portion of a side surface of the first barrier layer 141 may be exposed through the cavity C, and at least a portion of the side surface exposed through the cavity C of the first barrier layer 141 may not have a step difference with a wall surface of cavity C. For example, a groove may be prevented from being formed on an edge of the cavity C.

The other descriptions may be substantially the same as those described with respect to the printed circuit board 100D according to another example described above, and accordingly, overlapping descriptions will not be provided.

FIGS. 10A to 10D are cross-sectional diagrams illustrating an example of processes of manufacturing the printed circuit board in FIG. 8.

Figure 10A:
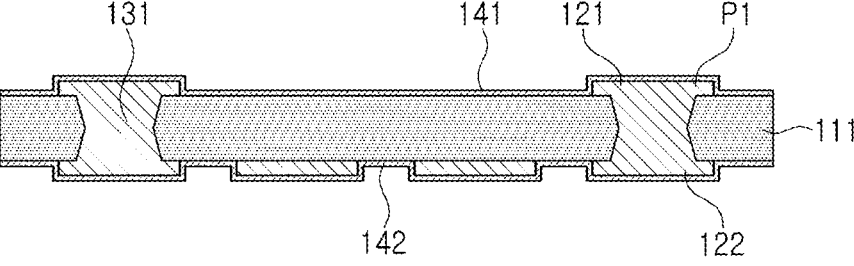
FIGS. 10A, 10B, 10C, and 10D are cross-sectional diagrams illustrating an example of processes of manufacturing the printed circuit board in FIG. 8.

Referring to FIG. 10A, first, a through-hole may be formed in the first insulating layer 111 through laser processing, and the first and second wiring layers 121 and 122 and the first via layer 131 may be formed through a plating process. Thereafter, first and second barrier layers 141 and 142 may be formed on upper and lower surfaces of the first insulating layer 111 by covering the first and second wiring layers 121 and 122, respectively, using a thin film deposition method, such as an atomic layer deposition (ALD) method and a molecular vapor deposition (MVD) method.

Figure 10B:
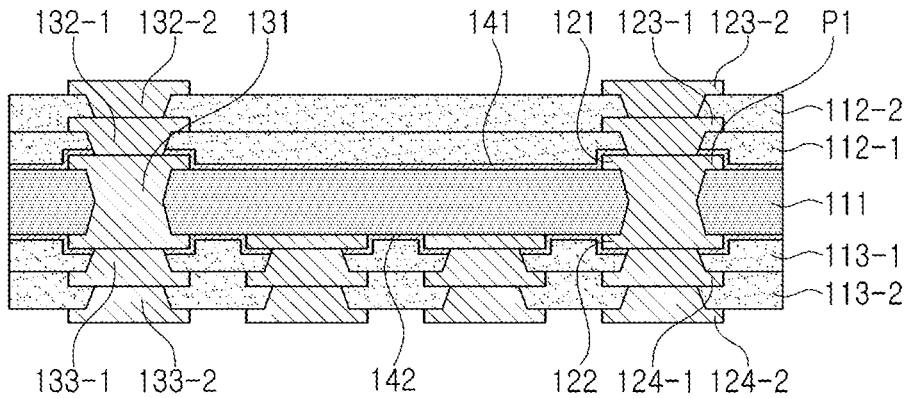

Referring to FIG. 10B, using a build-up process, one or more second insulating layers 112-1 and 112-2, one or more third insulating layers 113-1 and 113-2, one or more third wiring layers 123-1 and 123-2, one or more fourth wiring layers 124-1 and 124-2, one or more second via layers 132-1 and 132-2, and one or more third via layers 133-1 and 133-2 may be formed on the first insulating layer 111.

Figure 10C:
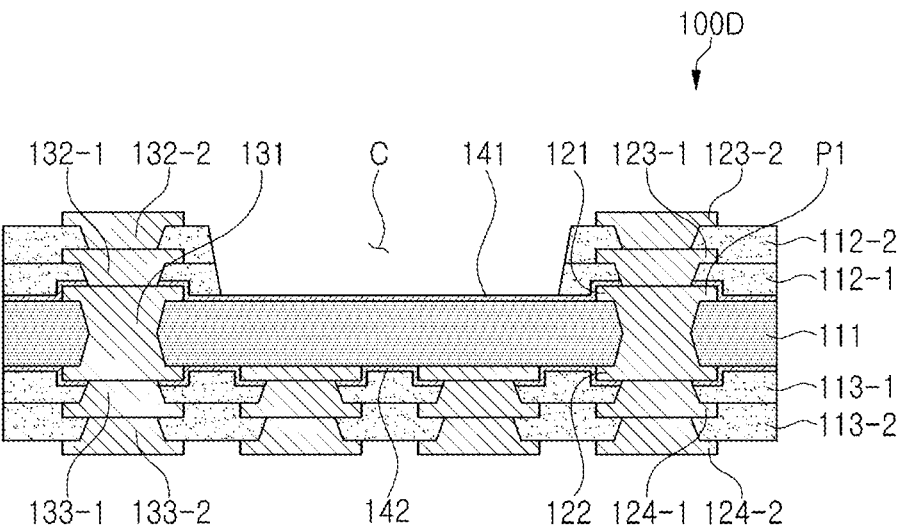

Referring to FIG. 10C, a cavity C penetrating through one or more second insulating layers 112-1 and 112-2 may be formed through $CO_2$ laser processing using the first barrier layer 141 as a stopper. Through a series of processes, the printed circuit board 100D according to another example described above may be manufactured.

Figure 10D:
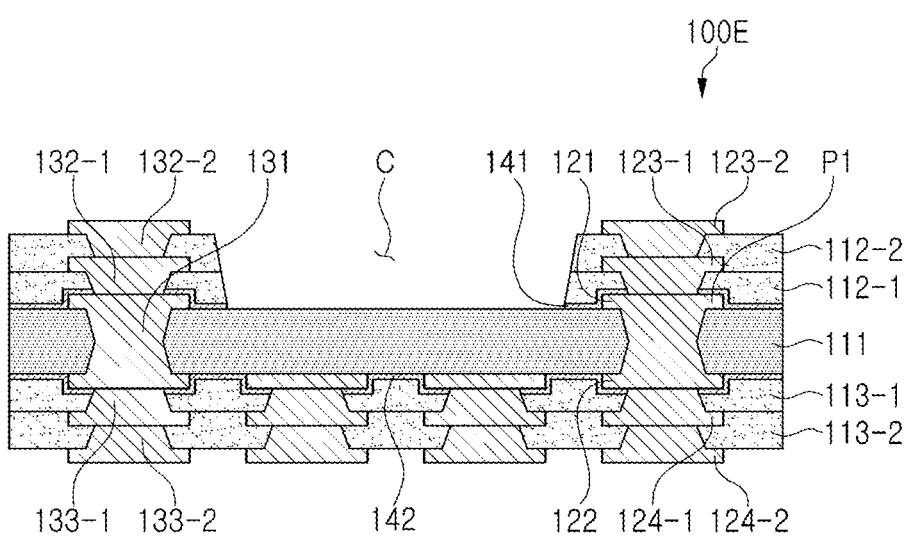

Referring to FIG. 10D, at least a portion of the first barrier layer 141 exposed through the cavity C may be removed by plasma etching. Through a series of processes, the printed circuit board 100E according to another example described above may be manufactured.

The other descriptions may be substantially the same as those described with respect to the printed circuit boards 100D and 100E above, and accordingly, overlapping descriptions will not be provided.

Figure 11:
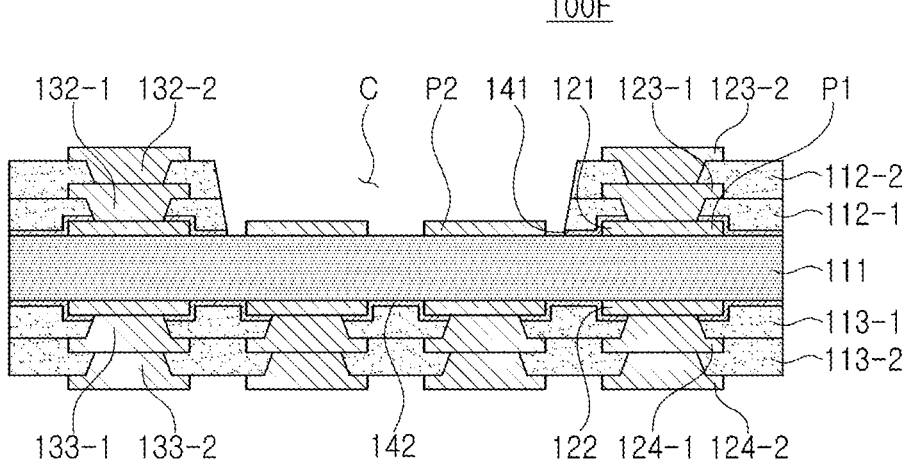
FIG. 11 is a cross-sectional diagram illustrating another example of a printed circuit board.

FIG. 11 is a cross-sectional diagram illustrating another example of a printed circuit board.

Referring to the drawings, in a printed circuit board 100F according to another example, differently from the printed circuit board 100E according to another example described above, at least a portion P2 of the first wiring layer 121 may be exposed through a cavity C. In this case, the component disposed in the cavity C may be connected to at least a portion P2 of the first wiring layer 121 and may be electrically connected to the circuit in the board. Accordingly, various electrical connection paths may be assured.

The other descriptions may be substantially the same as those described with respect to the printed circuit boards 100D and 100E above, and accordingly, overlapping descriptions will not be provided.

FIGS. 12A to 12D are cross-sectional diagrams illustrating an example of processes of manufacturing the printed circuit board in FIG. 11.

Figure 12A:
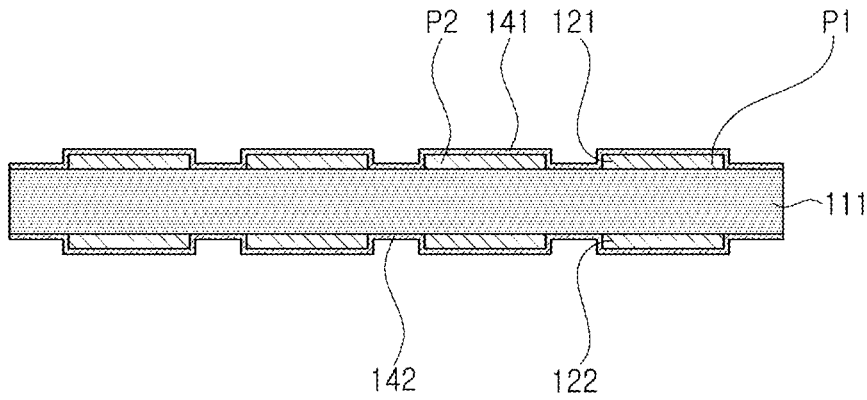
FIGS. 12A, 12B, 12C, and 12D are cross-sectional diagrams illustrating an example of processes of manufacturing the printed circuit board in FIG. 11.

Referring to FIG. 12A, first, a through-hole may be formed in the first insulating layer 111 through laser processing, and the first and second wiring layers 121 and 122 and the first via layer 131 may be formed through a plating process. Thereafter, the first and second barrier layers 141 and 142 may be formed on upper and lower surfaces of the first insulating layer 111 by covering the first and second wiring layers 121 and 122, respectively, using a thin film deposition method, such as an atomic layer deposition (ALD) method and a molecular vapor deposition (MVD) method.

Figure 12B:
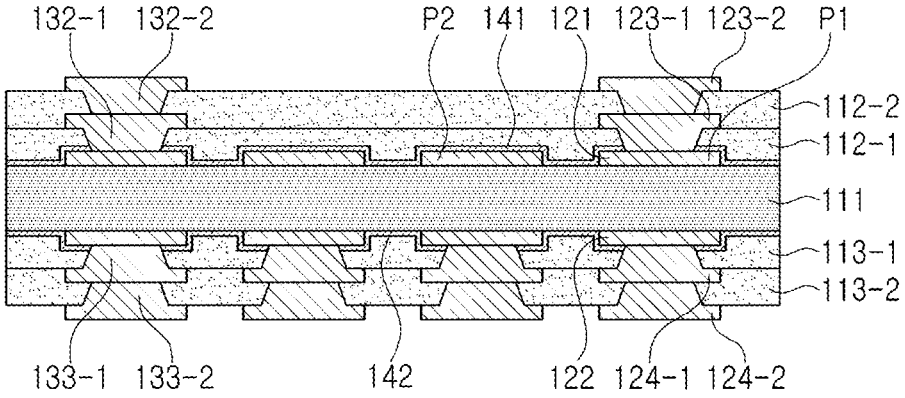

Referring to FIG. 12B, using a build-up process, one or more second insulating layers 112-1 and 112-2, one or more third insulating layers 113-1 and 113-2, one or more third wiring layers 113-1 and 113-2, one or more third wiring layers 123-1 and 123-2, one or more fourth wiring layers 124-1, 124-2, one or more second via layers 132-1, 132-2, and one or more third via layers 133-1, 133-2 may be formed on the first insulating layer 111.

Figure 12C:
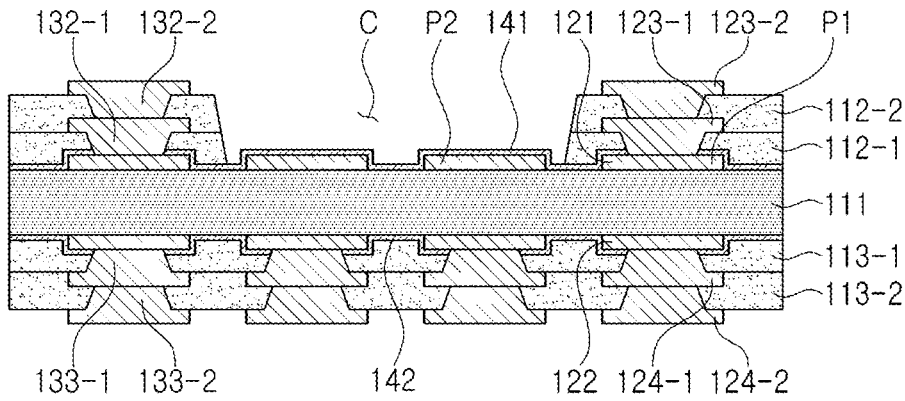
Figure 12D:
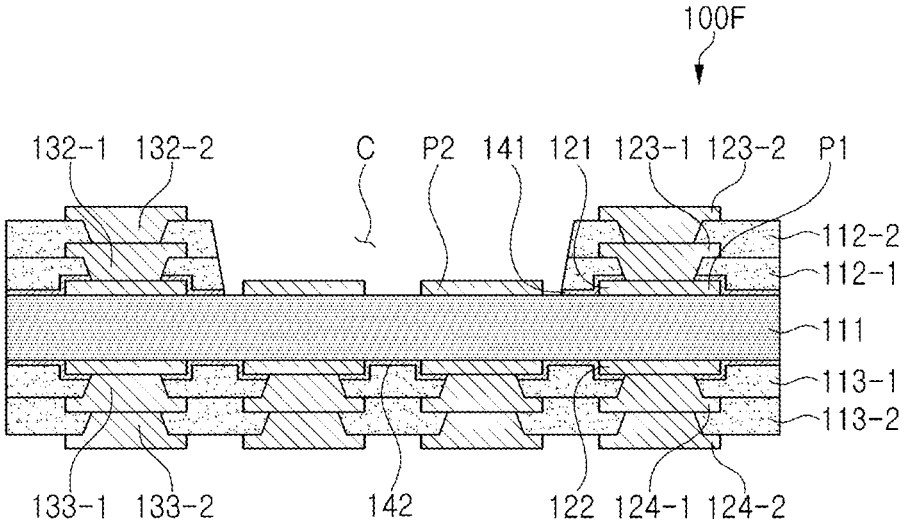

Referring to FIGS. 12C and 12D, first, the cavity C penetrating through more than one second insulating layer 112-1 and 112-2 may be formed through $CO_2$ laser processing using the first barrier layer 141 as a stopper. Thereafter, at least a portion of the first barrier layer 141 exposed through the cavity C may be removed by plasma etching. Through a series of processes, the printed circuit board 100F according to another example described above may be manufactured.

The other descriptions may be substantially the same as those described with respect to the above-mentioned printed circuit boards 100D, 100E, and 100F, and accordingly, overlapping descriptions will not be provided.

Figure 13:
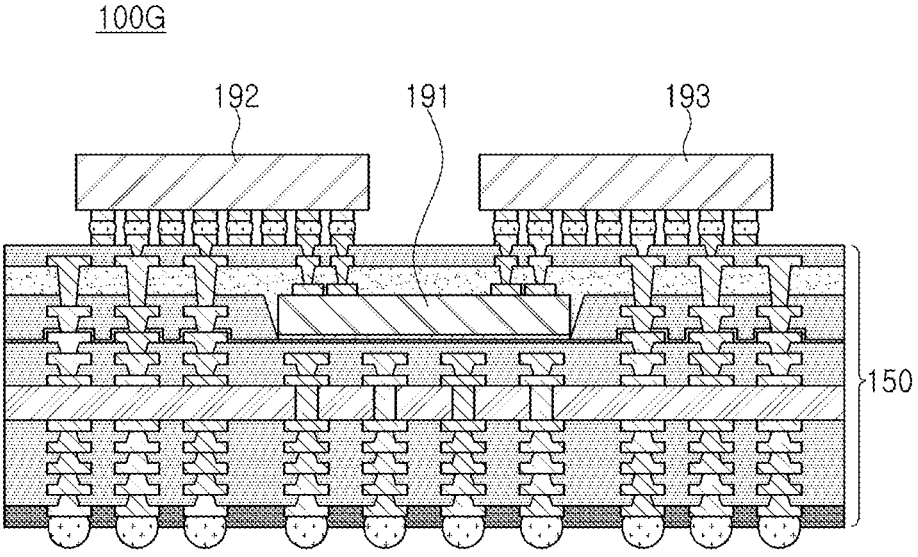
FIG. 13 is a cross-sectional diagram illustrating another example of a printed circuit board.

FIG. 13 is a cross-sectional diagram illustrating another example of a printed circuit board.

Referring to the drawings, a printed circuit board 100G according to another example may have a package form. For example, a first component 191 may be embedded in a package board 150, and the second and third components 192 and 193 may be mounted on the package board 150, respectively. The package board 150 may include the printed circuit boards 100A, 100B, 100C, 100D, 100E, and 100F described above. For example, the structure of the printed circuit board 100D according to another example may be partially modified and may be applied to the package board 150 of the printed circuit board 100G according to another example. In the package board 150, as for the other components, components of a typical package board generally used in the relevant technical field may be applied. The first component 191 may be a bridge for interconnecting the second and third components 192 and 193, and the bridge may be an organic bridge and/or a silicon bridge. The second and third components 192 and 193 may be semiconductor chips of the same type or different types. If desired, the barrier layer may be formed on the layers on other levels in addition to the stopper position to form the cavity. For example, the barrier layer may be formed on the entire layer on which the wiring layer is formed, but an embodiment thereof is not limited thereto. In the package board 150, the insulating layers may have distinct boundaries or indistinct boundaries therebetween. When the boundary is indistinct, the boundary may be distinct by drawing a conceptual line with respect to an upper surface or a lower surface of the wiring layer on each level in consideration of the manufacturing process.

The other descriptions may be substantially the same as those described in the above-described printed circuit boards 100A, 100B, 100C, 100D, 100E, and 100F, and accordingly, overlapping descriptions will not be provided.

According to the aforementioned example embodiments, by omitting a circuit process to remove the metal stopper layer, the processes may be simplified and accordingly, a printed circuit board with reduced costs may be provided.

Also, a printed circuit board in which an edge groove of the cavity, which may be formed when the metal stopper layer is removed, may be reduced may be provided.

Also, a printed circuit board in which design freedom of the cavity may be increased may be provided.

In the example embodiments, the cross-section may refer to a cross-sectional shape when an object is vertically cut, or a cross-sectional shape when the object is viewed from the side. Also, a plane may refer to a planar shape when the object is horizontally cut, or a planar shape when the object is viewed from the top or the bottom.

In the present disclosure, the example embodiments may include process errors, positional deviations, and measurement errors occurring in the process. For example, the configuration in which components are substantially the same may include the example in which the components are completely the same, and also the example in which a slight difference due to a process error may be present. Also, the configuration in which elements are substantially constant may include the example in which the elements are completely constant, and also the example in which a minute difference may be generated due to a process error.

In the example embodiments, the term "connected" may not only refer to "directly connected" but also include "indirectly connected" by may refer to of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in an example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present disclosure as defined by the appended claims.

What is claimed is:

1. A printed circuit board, comprising:
a first insulating layer;
a first wiring layer disposed on an upper surface of the first insulating layer;
a second insulating layer disposed on the upper surface of the first insulating layer and having a cavity; and
a first barrier layer having at least a portion disposed between the first and second insulating layers and in contact with a side surface of at least a portion of the first wiring layer, wherein the first barrier layer contacts at least a portion of an uppermost surface or a lowermost surface of the first wiring layer.

2. The printed circuit board of claim 1, wherein the first barrier layer includes an alumina film having a thickness less than 0.1 μm.

3. The printed circuit board of claim 1, wherein at least a portion of the first barrier layer is disposed on a bottom surface of the cavity.

4. The printed circuit board of claim 3, further comprising:
a first component disposed in the cavity and attached to at least a portion of the first barrier layer disposed on the bottom surface of the cavity; and
second and third components disposed on an upper surface of the second insulating layer and connected to the first component.

5. The printed circuit board of claim 1, wherein the cavity exposes at least a portion of the upper surface of the first insulating layer.

6. The printed circuit board of claim 5, wherein at least a portion of a side surface of the first barrier layer is exposed through the cavity.

7. The printed circuit board of claim 6, wherein at least a portion of a side surface of the first barrier layer exposed through the cavity does not have a step difference with a wall surface of the cavity.

8. The printed circuit board of claim 5, wherein at least a portion of the first wiring layer is exposed through the cavity.

9. The printed circuit board of claim 1, further comprising:
a second wiring layer disposed on a lower surface of the first insulating layer;
a first via layer penetrating through at least a portion of the first insulating layer and connecting at least a portion of the first wiring layer to at least a portion of the second wiring layer;
a third wiring layer embedded in an upper side of the second insulating layer; and
a second via layer penetrating through at least a portion of the second insulating layer and connecting at least a portion of the first wiring layer to at least a portion of the third wiring layer,
wherein the first wiring layer is embedded in an upper side of the first insulating layer.

10. The printed circuit board of claim 9, wherein the first barrier layer covers at least a portion of each of a side surface and a lower surface of at least a portion of the first wiring layer, and at least a portion is in contact with a side surface of the first via layer.

11. The printed circuit board of claim 9,
wherein the cavity exposes at least a portion of the upper surface of the first insulating layer, and
wherein at least a portion of the upper surface of the first insulating layer exposed through the cavity has a step difference from an upper surface of a first portion of the first wiring layer.

12. The printed circuit board of claim 11,
wherein a second portion of the first wiring layer is exposed through the cavity, and
wherein the upper surface of the first portion of the first wiring layer has a step difference from an upper surface of at least a portion of the second portion of the first wiring layer.

13. The printed circuit board of claim 9, wherein the first wiring layer is embedded from the upper surface of the first insulating layer, and the second wiring layer protrudes from the lower surface of the first insulating layer.

14. The printed circuit board of claim 1, further comprising:

a second wiring layer disposed on a lower surface of the first insulating layer;

a first via layer penetrating through at least a portion of the first insulating layer and connecting at least a portion of the first wiring layer to at least a portion of the second wiring layer;

a third wiring layer disposed on an upper surface of the second insulating layer;

a second via layer penetrating through at least a portion of the second insulating layer and connecting at least a portion of the first wiring layer to at least a portion of the third wiring layer;

a third insulating layer disposed on a lower surface of the first insulating layer;

a fourth wiring layer disposed on a lower surface of the third insulating layer;

a third via layer penetrating through at least a portion of the third insulating layer and connecting at least a portion of the second wiring layer to at least a portion of the fourth wiring layer; and a second barrier layer having at least a portion disposed between the first and third insulating layers and in contact with a side surface of at least a portion of the second wiring layer.

15. The printed circuit board of claim 14, wherein the first barrier layer covers at least a portion of each of a side surface and an upper surface of at least a portion of the first wiring layer, and at least a portion of the first barrier layer is in contact with a side surface of the second via layer, and wherein the second barrier layer covers at least a portion of each of a side surface and a lower surface of at least a portion of the second wiring layer, and at least a portion of the second barrier layer is in contact with a side surface of the third via layer.

16. The printed circuit board of claim 14, wherein the first wiring layer and the second wiring layer protrude from the upper surface and the lower surface, respectively, of the first insulating layer.

17. A printed circuit board, comprising:

a first insulating layer;

a wiring layer disposed on an upper surface of the first insulating layer;

a second insulating layer disposed on an upper surface of the first insulating layer and having a cavity; and a barrier layer having at least a portion disposed between the first and second insulating layers, and having a stepped portion defined by a first leg in contact with at least a portion of a side surface of the first wiring layer and a second leg in contact with at least a portion of an upper surface or a lower surface of the first wiring layer, wherein an upper surface of the barrier layer and an upper surface of the wiring layer, or a lower surface of the barrier layer and a lower surface of the wiring layer are substantially coplanar with each other.

18. The printed circuit board of claim 17, wherein the barrier layer includes an alumina film having a thickness less than 0.1 μm.

19. The printed circuit board of claim 17, wherein at least a portion of the barrier layer is disposed on a bottom surface of the cavity.

\* \* \* \* \*